United States Patent
Prakash et al.

(10) Patent No.: US 11,489,498 B1
(45) Date of Patent: Nov. 1, 2022

(54) MINIMIZING TOTAL HARMONIC DISTORTION AND POWER SUPPLY INDUCED INTERMODULATION DISTORTION IN A SINGLE-ENDED CLASS-D PULSE WIDTH MODULATION AMPLIFIER

(71) Applicant: Cirrus Logic International Semiconductor Ltd., Edinburgh (GB)

(72) Inventors: Chandra Prakash, Austin, TX (US); Cory J. Peterson, Austin, TX (US); Eric Kimball, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 17/338,160

(22) Filed: Jun. 3, 2021

(51) Int. Cl.
*H03F 3/217* (2006.01)
*H03F 1/32* (2006.01)

(52) U.S. Cl.
CPC .......... *H03F 1/3205* (2013.01); *H03F 3/217* (2013.01); *H03F 2200/03* (2013.01)

(58) Field of Classification Search
CPC ..... H03F 1/3205; H03F 3/217; H03F 2200/03
USPC ...................... 330/251, 297, 207 A
See application file for complete search history.

(56) References Cited

U.S. PATENT DOCUMENTS

| | | | |
|---|---|---|---|
| 6,316,992 B1 | 11/2001 | Miao et al. | |
| 7,262,658 B2 * | 8/2007 | Ramaswamy | H03F 3/2173 330/10 |
| 7,679,435 B2 * | 3/2010 | Tsuji | H03F 3/2175 330/10 |

(Continued)

OTHER PUBLICATIONS

International Search Report and Written Opinion of the International Searching Authority, International Application No. PCT/US2022/029988, dated Sep. 9, 2022.

*Primary Examiner* — Hieu P Nguyen
(74) *Attorney, Agent, or Firm* — Jackson Walker L.L.P.

(57) ABSTRACT

An amplifier system may include a first stage having a plurality of inputs configured to receive a differential pulse-width modulation input signal and generate an intermediate signal based on the differential pulse-width modulation input signal, a quantizer configured to generate a modulated signal based on the intermediate signal, a single-ended class-D output stage configured to generate a single-ended output signal as a function of the differential pulse-width modulation input signal, a feedback network configured to feed back the single-ended output signal to a first input of the plurality of inputs and to feed back a ground voltage to a second input of the plurality of inputs, a plurality of buffers, each particular buffer configured to receive a respective component of the differential pulse-width modulation input signal and generate a respective buffered component, and an input network coupled between the plurality of buffers and the first stage. Each particular buffer of the plurality of buffers may include a buffering subcircuit configured to buffer the respective component of the differential pulse-width modulation input signal associated with the particular buffer in order to generate the respective buffered component and a biasing subcircuit configured to limit a magnitude of the respective component of the differential pulse-width modulation input signal driven to circuitry of the buffering subcircuit for driving the respective buffered component.

18 Claims, 7 Drawing Sheets

(56) References Cited

U.S. PATENT DOCUMENTS

2007/0024365 A1   2/2007   Ramaswamy et al.

* cited by examiner

MINIMIZING TOTAL HARMONIC DISTORTION AND POWER SUPPLY INDUCED INTERMODULATION DISTORTION IN A SINGLE-ENDED CLASS-D PULSE WIDTH MODULATION AMPLIFIER

FIELD OF DISCLOSURE

The present disclosure relates in general to circuits for audio devices, including without limitation personal audio devices, such as wireless telephones and media players, and more specifically, to systems and methods for minimizing total harmonic distortion and power supply intermodulation distortion in a class-D pulse width modulation amplifier.

BACKGROUND

Personal audio devices, including wireless telephones, such as mobile/cellular telephones, cordless telephones, mp3 players, and other consumer audio devices, are in widespread use. Such personal audio devices may include circuitry for driving a pair of headphones or one or more speakers. Such circuitry often includes a power amplifier for driving an audio output signal to headphones or speakers. Generally speaking, a power amplifier amplifies an audio signal by taking energy from a power supply and controlling an audio output signal to match an input signal shape but with a larger amplitude.

One example of an audio amplifier is a class-D amplifier. A class-D amplifier (also known as a "switching amplifier") may comprise an electronic amplifier in which the amplifying devices (e.g., transistors, typically metal-oxide-semiconductor field effect transistors) operate as electronic switches. In a class-D amplifier, a signal to be amplified may be converted to a series of pulses by pulse-width modulation (PWM), pulse-density modulation (PDM), or another method of modulation, such that the signal is converted into a modulated signal in which a characteristic of the pulses of the modulated signal (e.g., pulse widths, pulse density, etc.) is a function of the magnitude of the signal. After amplification with a class-D amplifier, the output pulse train may be converted to an unmodulated analog signal by passing through a passive low-pass filter, wherein such low-pass filter may be inherent in the class-D amplifier or a load driven by the class-D amplifier. Class-D amplifiers are often used due to the fact that they may be more power efficient than linear analog amplifiers, in that class-D amplifiers may dissipate less power as heat in active devices as compared to linear analog amplifiers.

Class-D amplifiers may include single-ended output class-D amplifiers and differential output class-D amplifiers. Single-ended output class-D amplifiers may be preferable in some applications, as they may require a smaller amount of area compared to differential output class-D amplifiers, as a single-ended output class-D amplifier may require only a single output driver while a differential output class-D amplifier may require two output drivers. However, a disadvantage of a single-ended output class-D amplifier is that due to its single-ended nature, a common-mode current may flow through feedback paths of the single-ended output class-D amplifier to pulse-width modulation (PWM) input buffers of the single-ended output class-D amplifier at the input signal frequency, and such common-mode current may be input-signal dependent. Such common mode current may cause a differential component at twice the input signal frequency which may be amplified by the single-ended output class-D amplifier to create degradation in total harmonic distortion. Due to presence of even-order harmonics, power supply induced intermodulation distortion degradation may also occur.

Accordingly, systems and methods for minimizing total harmonic distortion and power supply induced intermodulation distortion degradation in a single-ended output class-D PWM amplifier may be desirable.

SUMMARY

In accordance with the teachings of the present disclosure, one or more disadvantages and problems associated with existing approaches to minimizing distortion in a Class-D pulse width modulation amplifier may be reduced or eliminated.

In accordance with embodiments of the present disclosure, an amplifier system may include a first stage having a plurality of inputs configured to receive a differential pulse-width modulation input signal and generate an intermediate signal based on the differential pulse-width modulation input signal, a quantizer configured to generate a modulated signal based on the intermediate signal, a single-ended class-D output stage configured to generate a single-ended output signal as a function of the differential pulse-width modulation input signal, a feedback network configured to feed back the single-ended output signal to a first input of the plurality of inputs and to feed back a ground voltage to a second input of the plurality of inputs, a plurality of buffers, each particular buffer configured to receive a respective component of the differential pulse-width modulation input signal and generate a respective buffered component, and an input network coupled between the plurality of buffers and the first stage. Each particular buffer of the plurality of buffers may include a buffering subcircuit configured to buffer the respective component of the differential pulse-width modulation input signal associated with the particular buffer in order to generate the respective buffered component and a biasing subcircuit configured to limit a magnitude of the respective component of the differential pulse-width modulation input signal driven to circuitry of the buffering subcircuit for driving the respective buffered component.

In accordance with these and other embodiments of the present disclosure, a method may be provided for an amplifier having a first stage having a plurality of inputs configured to receive a differential pulse-width modulation input signal and generate an intermediate signal based on the differential pulse-width modulation input signal, a quantizer configured to generate a modulated signal based on the intermediate signal, a single-ended class-D output stage configured to generate a single-ended output signal as a function of the differential pulse-width modulation input signal, and a feedback network configured to feed back the single-ended output signal to a first input of the plurality of inputs and to feed back a ground voltage to a second input of the plurality of inputs, a plurality of buffers, each particular buffer configured to receive a respective component of the differential pulse-width modulation input signal and generate a respective buffered component, and an input network coupled between the plurality of buffers and the first stage. The method may include buffering, with a respective buffering subcircuit of each particular buffer, the respective component of the differential pulse-width modulation input signal associated with the particular buffer in order to generate the respective buffered component, and limiting, with a biasing subcircuit of each particular buffer, a magnitude of the respective component of the differential pulse-width modulation input signal driven to circuitry of the buffering subcircuit for driving the respective buffered component.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
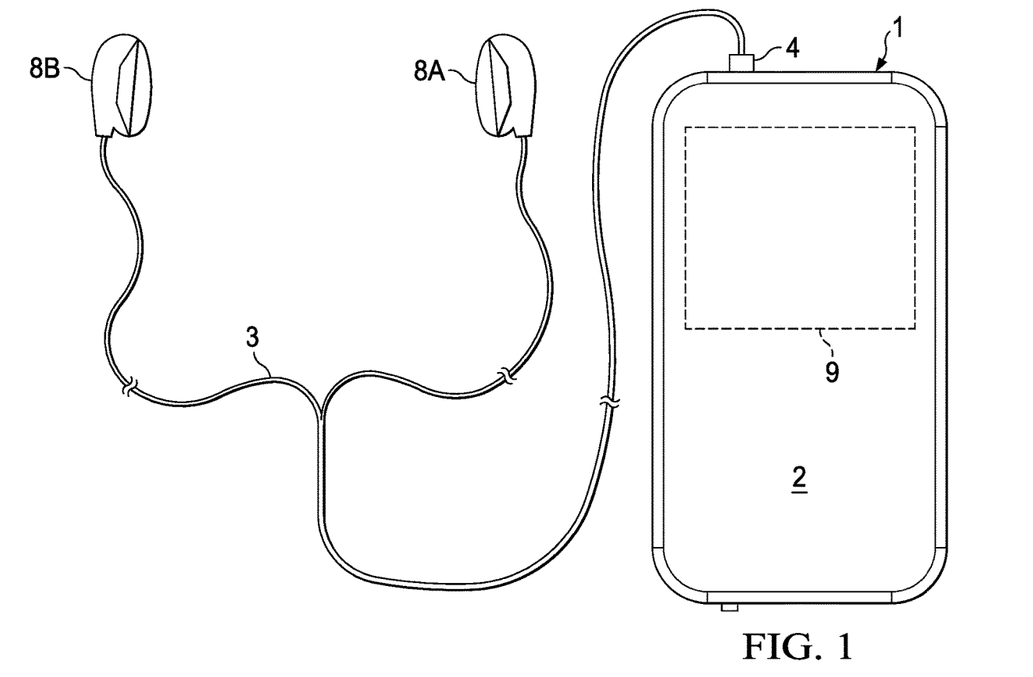
FIG. 1 is an illustration of an example personal audio device, in accordance with embodiments of the present disclosure.

FIG. 1 is an illustration of an example personal audio device 1, in accordance with embodiments of the present disclosure. FIG. 1 depicts personal audio device 1 coupled to a headset 3 in the form of a pair of earbud speakers 8A and 8B. Headset 3 depicted in FIG. 1 is merely an example, and it is understood that personal audio device 1 may be used in connection with a variety of audio transducers, including without limitation, headphones, earbuds, in-ear earphones, and external speakers. A plug 4 may provide for connection of headset 3 to an electrical terminal of personal audio device 1. Personal audio device 1 may provide a display to a user and receive user input using a touch screen 2, or alternatively, a standard liquid crystal display (LCD) may be combined with various buttons, sliders, and/or dials disposed on the face and/or sides of personal audio device 1. As also shown in FIG. 1, personal audio device 1 may include an audio integrated circuit (IC) 9 for generating an analog audio signal for transmission to headset 3 and/or another audio transducer.

Figure 2:
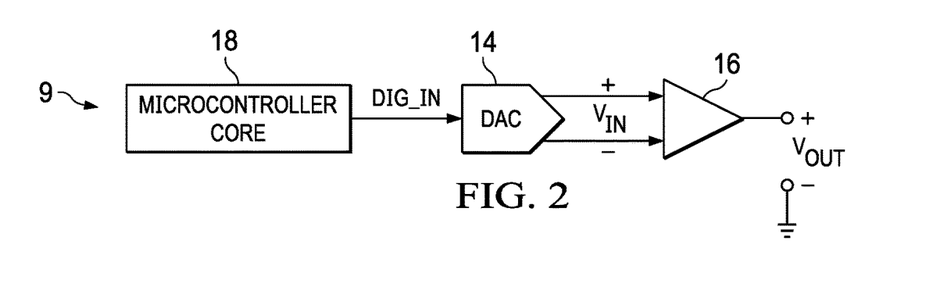
FIG. 2 illustrates a block diagram of selected components of an example audio integrated circuit of a personal audio device, in accordance with embodiments of the present disclosure.

FIG. 2 illustrates a block diagram of selected components of an example audio IC 9 of a personal audio device, in accordance with embodiments of the present disclosure. In some embodiments, example audio IC 9 may be used to implement audio IC 9 of FIG. 1. As shown in FIG. 2, a microcontroller core 18 may supply a digital audio input signal DIG_IN to a digital-to-analog converter (DAC) 14, which may convert the digital audio input signal to an analog input signal $Y_{IN}$. DAC 14 may supply analog input signal $V_{IN}$ (e.g., in the form of a differential PWM signal) to an amplifier 16 which may amplify or attenuate analog input signal $Y_{IN}$ to provide an audio output signal $V_{OUT}$, which may operate a speaker, headphone transducer, a line level signal output, and/or other suitable output.

Figure 3:
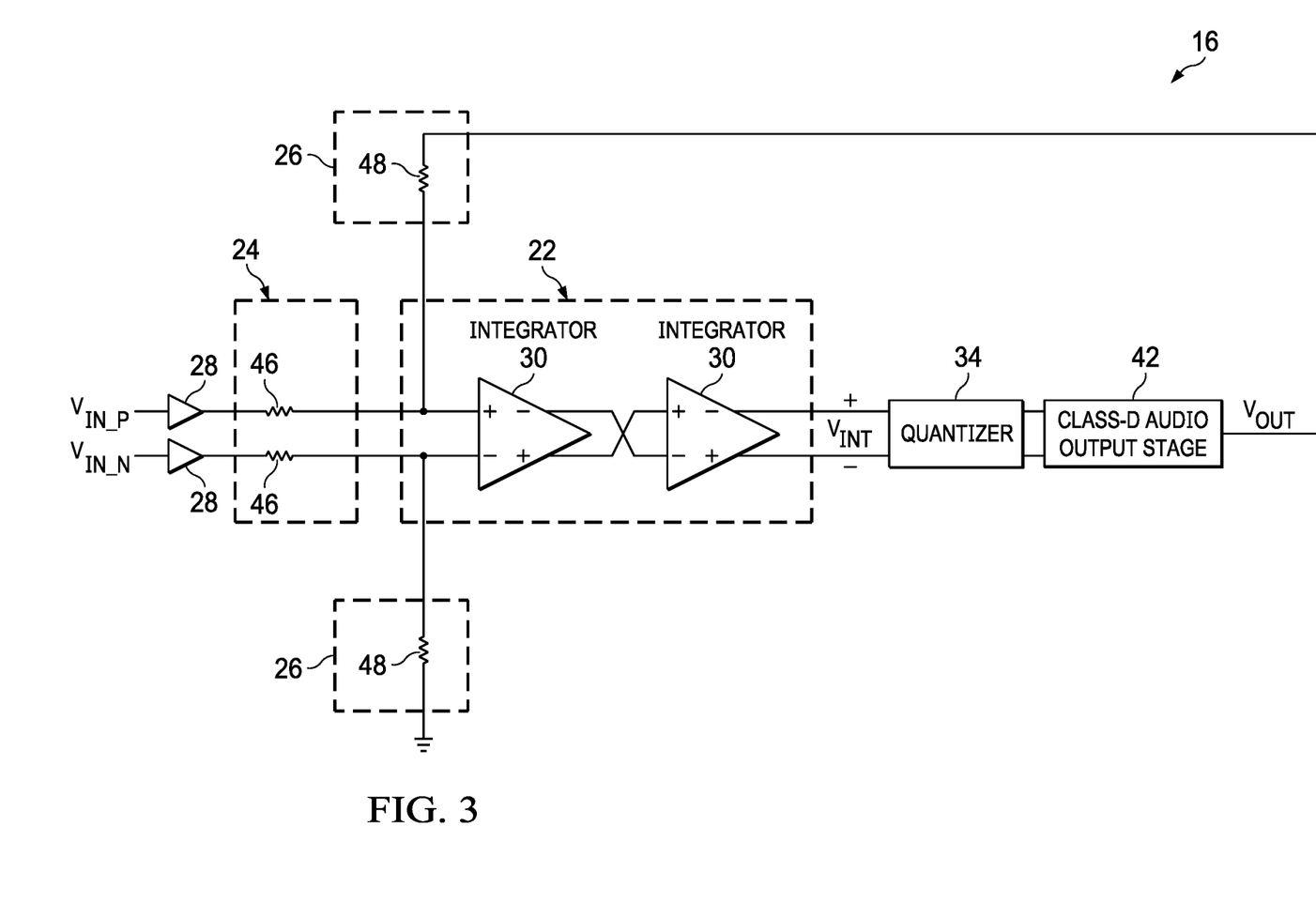
FIG. 3 illustrates a block diagram of selected components of an example amplifier, in accordance with embodiments of the present disclosure.

FIG. 3 illustrates a block diagram of selected components of an example amplifier 16, in accordance with embodiments of the present disclosure. In some embodiments, amplifier 16 may be used to implement all or a portion of amplifier 16 of FIG. 2. As shown in FIG. 3, amplifier 16 may receive input signal $Y_{IN}$ in the form of a differential PWM input signal having components $V_{IN\_P}$ and $Y_{IN\_N}$. Amplifier 16 may include a plurality of input buffers 28, signal input network 24, a first stage 22 (e.g., an analog front end) configured to receive analog input signal $Y_{IN}$ at an amplifier input of amplifier 16 and generate an intermediate signal $V_{INT}$ which is a function of analog input signal $V_{IN}$, a quantizer 34, a final output stage comprising a class-D audio output stage 42 configured to generate audio output signal $V_{OUT}$ at an amplifier output of amplifier 16 as a function of quantized intermediate signal $V_{INT}$, and a signal feedback network 26 coupled between the amplifier output and the amplifier input.

As depicted in FIG. 3, each of components $V_{IN\_P}$ and $Y_{IN\_N}$ may be buffered by a respective input buffer 28. Signal input network 24 may include any suitable input network receiving the amplifier input of amplifier 16. For example, as shown in FIG. 3, signal input network 24 may include respective input resistors 46 for each of input signal components $V_{IN\_P}$ and $Y_{IN\_N}$.

First stage 22 may include any suitable analog front end circuit for conditioning analog input signal $V_{IN}$ for use by class-D audio output stage 42. For example, first stage 22 may include one or more analog integrators 30 cascaded in series, as shown in FIG. 3. A first-stage analog integrator 30 may receive at its first input terminal input signal component $V_{IN\_P}$, as buffered by input buffer 28 and conditioned by input resistor 46, and may receive at its second input terminal input signal component $V_{IN\_N}$ as buffered by input buffer 28 and conditioned by input resistor 46.

Quantizer 34 may comprise any system, device, or apparatus configured to quantize intermediate signal $V_{INT}$ to generate an equivalent digital PWM signal. As shown in FIG. 3, quantizer 34 may have a variable signal gain controlled by one or more control signals received from control subsystem 28, as described in greater detail below.

Class-D audio output stage 42 may comprise any system, device, or apparatus configured to receive the output of quantizer 34 and drive an output signal $V_{OUT}$ which is an amplified version of analog input signal $Y_{IN}$. Accordingly, class-D audio output stage 42 may comprise a plurality of output switches configured to generate output signal $V_{OUT}$ from a modulated signal generated by quantizer 34. After amplification by class-D audio output stage 42, its output pulse train may be converted back to an unmodulated analog signal by passing through a passive low-pass filter, wherein such low-pass filter may be inherent in output circuitry of class-D audio output stage 42 or a load driven by class-D audio output stage 42.

Signal feedback network 26 may include any suitable feedback network for feeding back a signal indicative of audio output signal $V_{OUT}$, and feeding back a ground voltage, to the amplifier input of amplifier 16. For example, as shown in FIG. 3, signal feedback network 26 may include feedback resistors 48. Those of skill in the art may recognize that a closed loop gain of amplifier 16 may be set by a ratio of the resistances of feedback resistors 48 to the resistances of input resistors 46.

Also, those of skill in the art may recognize that due to feedback action of signal feedback network 26, the summing nodes (positive and negative) of integrator 30 may be a virtual short, and due to the single-ended output nature of amplifier 16, the summing nodes of integrator 30 may swing at input signal frequency. This scenario may necessitate a common-mode current flow at input signal frequency from both positive- and negative-sides of feedback resistors 28 in the same direction.

Figure 4:
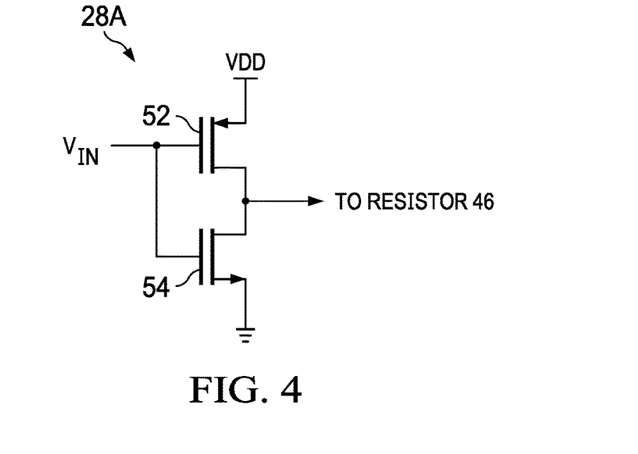
FIG. 4 illustrates a circuit diagram of an example input buffer, in accordance with embodiments of the present disclosure.

FIG. 4 illustrates a circuit diagram of an example input buffer 28A, in accordance with embodiments of the present disclosure. In some embodiments of amplifier 16, example input buffer 28A may be used to implement one or more of input buffers 28. As shown in FIG. 4, buffer 28A may include a pull-up device 52 (e.g., a p-type field-effect transistor) gate coupled to an input signal component $V_{IN}$ (e.g., $V_{IN\_P}$ or $V_{IN\_N}$) and coupled to a source voltage VDD via a non-gate terminal, wherein pull-up device 52 is coupled in series with a pull-down device 54 (e.g., a n-type field-effect transistor) gate coupled to the same input signal component $V_{IN}$ (e.g., $V_{IN\_P}$ or $V_{IN\_N}$) and coupled to a ground voltage via a non-gate terminal. Further, sizes of pull-up device 52 and pull-down device 54 may be selected to minimize impedances of pull-up device 52 and pull-down device 54 in order to minimize total harmonic distortion and power supply induced intermodulation distortion that may be caused due to mismatch in the "on" resistances of pull-up device 52 and pull-down device 54 (e.g., the resistances of such devices when they are conducting). Because of this mismatch, the common-mode current may intermodulate with the signal-dependent impedance presented by buffer 28A and create a second harmonic, which may be gained up along with the signal though amplifier 16, thus resulting in harmonic distortion. However, such approach to minimize distortion may require significant circuit area, especially in amplifiers 16 that include multiple gain taps to input resistors 46 having different gains for varying a gain of such amplifier 16.

Figure 5:
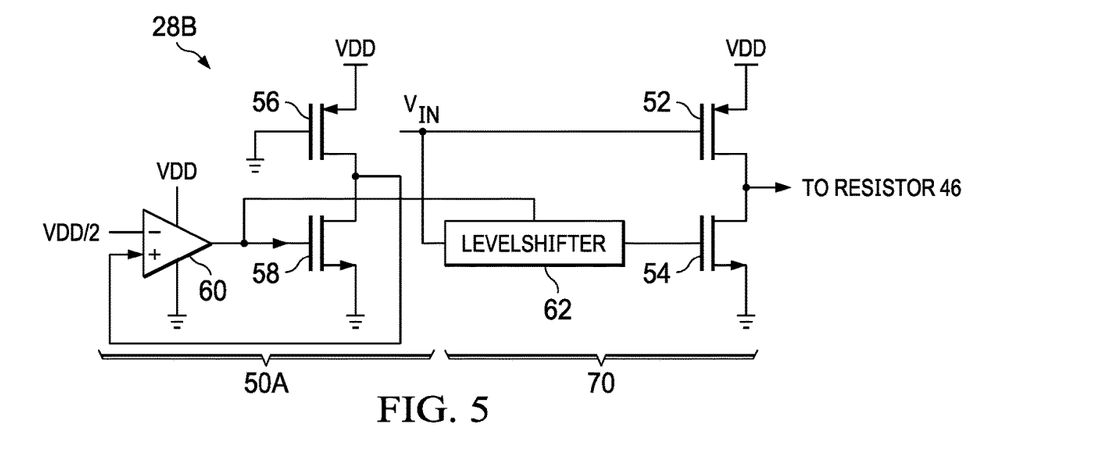
FIG. 5 illustrates a circuit diagram of another example input buffer, in accordance with embodiments of the present disclosure.

FIG. 5 illustrates a circuit diagram of another example input buffer 28B, in accordance with embodiments of the present disclosure. In some embodiments of amplifier 16, example input buffer 28B may be used to implement one or more of input buffers 28. As shown in FIG. 5, input buffer 28B may include a biasing subcircuit 50A and a buffering subcircuit 70. Biasing subcircuit 50A may include a pull-up device 56 (e.g., a p-type field-effect transistor) coupled to a source voltage VDD via a non-gate terminal and configured to always be activated (e.g., on), for example by tying its gate terminal to a ground voltage. Pull-up device 56 may be coupled in series with a pull-down device 58 (e.g., a n-type field-effect transistor) gate coupled to the output of an operational amplifier 60 and coupled to a ground voltage via a non-gate terminal. The output of biasing subcircuit 50A (e.g., the node at which pull-up device 56 and pull-down device 58 are coupled to one another) may be fed back to a non-inverting input of operational amplifier 60. The inverting input of operational amplifier 60 may be coupled to a voltage equal to one-half of source voltage VDD.

Buffering subcircuit 70 may be similar to input buffer 28A shown in FIG. 4, except that a level shifter 62 is interfaced between input signal component $Y_{IN}$ (e.g., $V_{IN\_P}$ or $V_{IN\_N}$) and the gate terminal of pull-down device 54. Accordingly, level-shifter 62 may effectively limit the voltage driven to the gate terminal of pull-down device 54 to the lesser of input signal component $Y_{IN}$ and the voltage output by operational amplifier 60. As a result, the output of biasing subcircuit 50A may be held to a voltage of approximately VDD/2, thus ensuring impedances of pull-up device 56 and pull-down device 58 are approximately equal across all operating and process conditions. In turn, by limiting the voltage driven to the gate terminal of pull-down device 54 using level shifter 62, impedances of pull-up device 52 and pull-down device 54 may be approximately equal across all operating and process conditions, thus reducing or eliminating effects of common-mode current flowing through signal feedback network 26 to input buffers 28.

Figure 6:
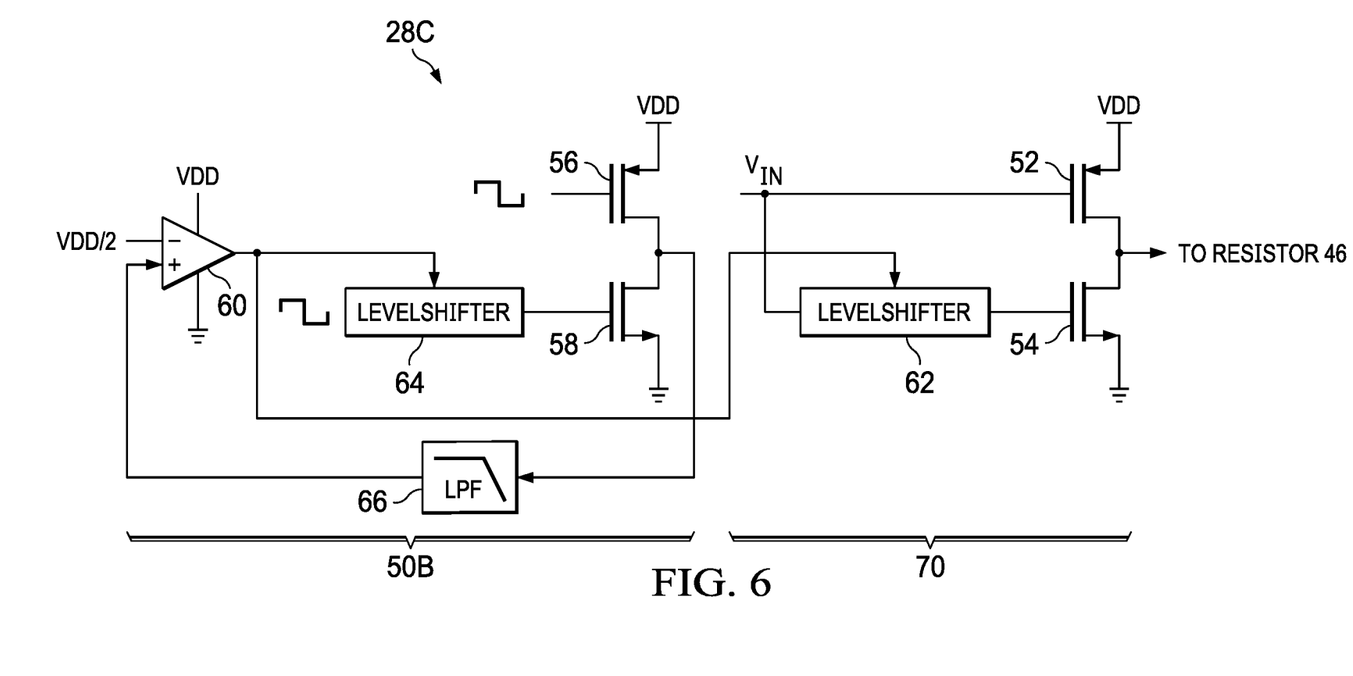
FIG. 6 illustrates a circuit diagram of another example input buffer, in accordance with embodiments of the present disclosure.

FIG. 6 illustrates a circuit diagram of another example input buffer 28C, in accordance with embodiments of the present disclosure. In some embodiments of amplifier 16, example input buffer 28C may be used to implement one or more of input buffers 28. As shown in FIG. 6, input buffer 28C may include a biasing subcircuit 50B and a buffering subcircuit 70. Buffering subcircuit 70 of input buffer 28C may be identical or similar in many respects to buffering subcircuit 70 of input buffer 28B.

However, biasing subcircuit 50B of input buffer 28C may be modified from biasing subcircuit 50A of input buffer 28B in that a 50% duty cycle PWM signal may drive the gate terminals of each of pull-up device 56 and pull-down device 58, with the voltage driven to the gate terminal of pull-down device 58 limited by a level shifter 64 to the voltage driven to the output of operational amplifier 60. Further, the output of biasing subcircuit 50B (e.g., the node at which pull-up device 56 and pull-down device 58 are coupled to one another) may be fed back to the non-inverting input of operational amplifier 60 via a low-pass filter 66. As a result, the output of biasing subcircuit 50B may be held to an average voltage of approximately VDD/2, thus ensuring impedances of pull-up device 56 and pull-down device 58 are approximately equal across all operating and process conditions. In turn, by limiting the voltage driven to the gate terminal of pull-down device 54 using level shifter 62, impedances of pull-up device 52 and pull-down device 54 may be approximately equal across all operating and process conditions, thus reducing or eliminating effects of common-mode current flowing through signal feedback network 26 to input buffers 28.

Figure 7:
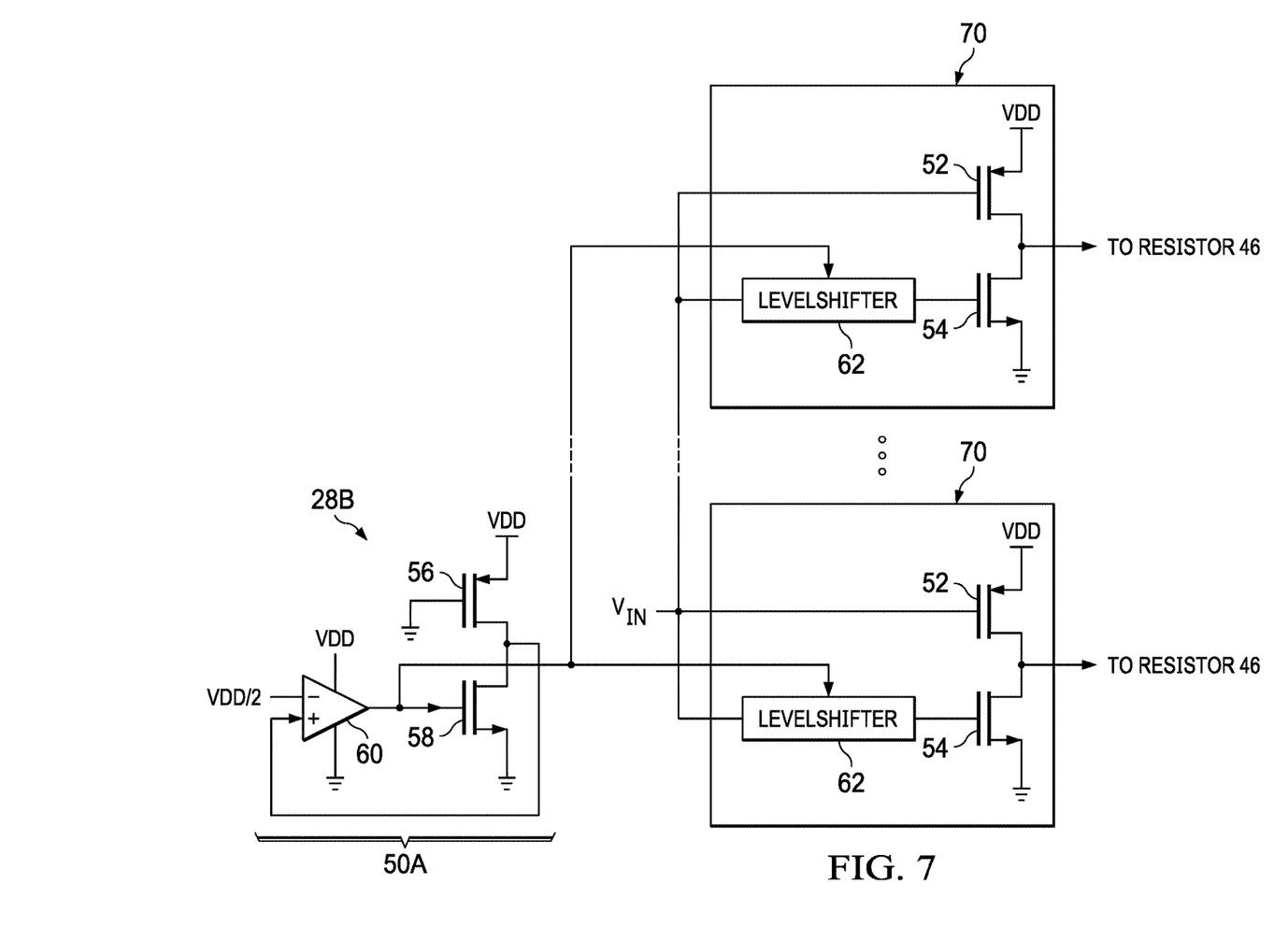
FIG. 7 illustrates a circuit diagram of example input buffers that may be used in an amplifier having multiple gain taps, in accordance with embodiments of the present disclosure.
Figure 8:
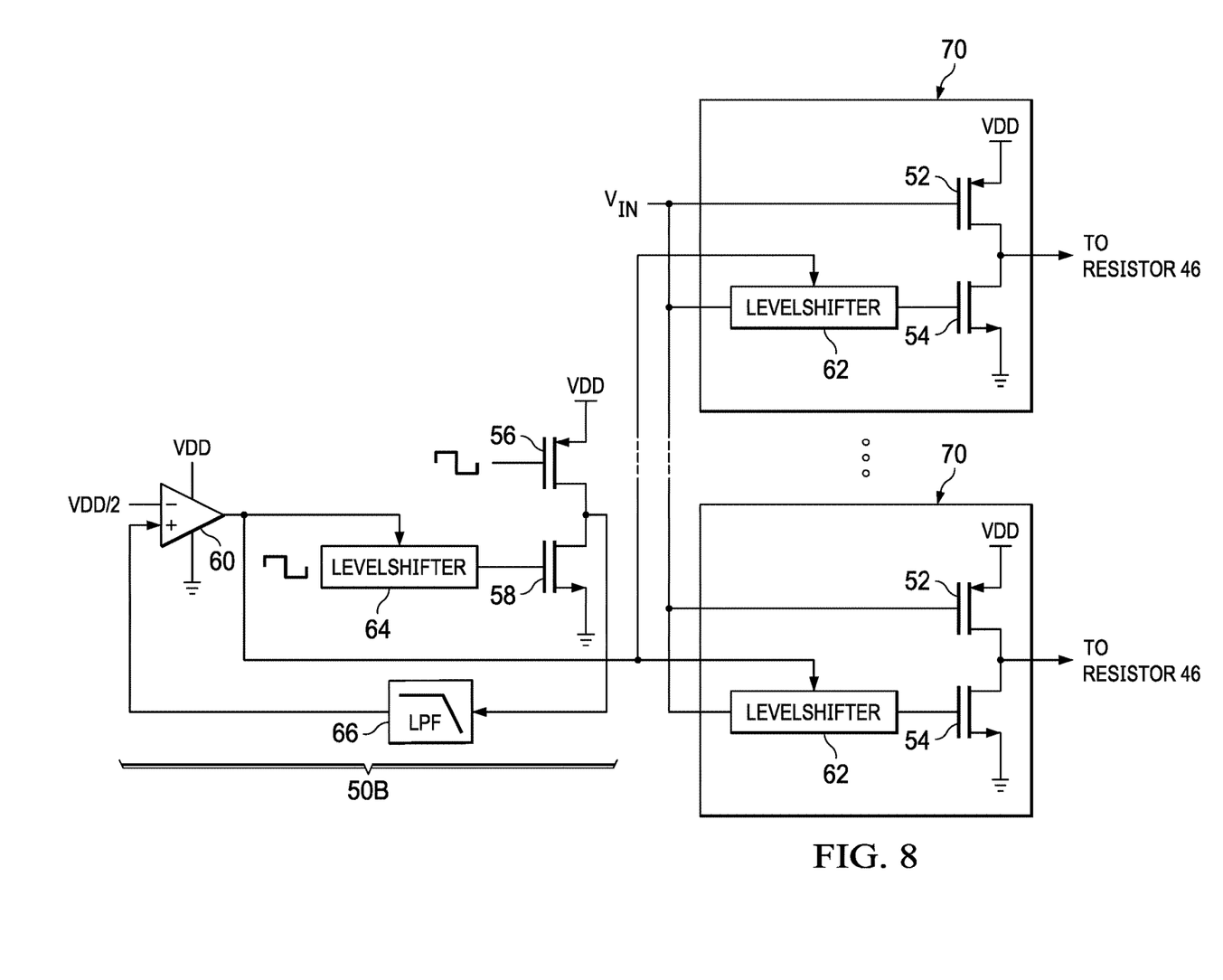
FIG. 8 illustrates a circuit diagram of additional example input buffers that may be used in an amplifier having multiple gain taps, in accordance with embodiments of the present disclosure.

The example input buffers 28A, 28B, and 28C described above may be useful in connection with amplifier 16 having no selectable gain taps in signal input network 24 for varying a gain of amplifier 16. However, in many practical applications, an input resistor 46 may have a variable resistance and thus may have multiple selectable gain taps for varying a gain of amplifier 16. In such cases, each gain tap may require its own respective buffering subcircuit 70, as shown in FIGS. 7 and 8. For example, as shown in FIG. 7, an input buffer 28 may logically be implemented with a biasing subcircuit 50A that biases a level shifter 62 for a plurality of buffering subcircuits 70, wherein each buffering subcircuit 70 drives its own respective gain tap for input resistor 46. Similarly, as shown in FIG. 8, an input buffer 28 may logically be implemented with a biasing subcircuit 50B that biases a level shifter 62 for a plurality of buffering subcircuits 70, wherein each buffering subcircuit 70 drives its own respective gain tap for input resistor 46.

Figure 9:
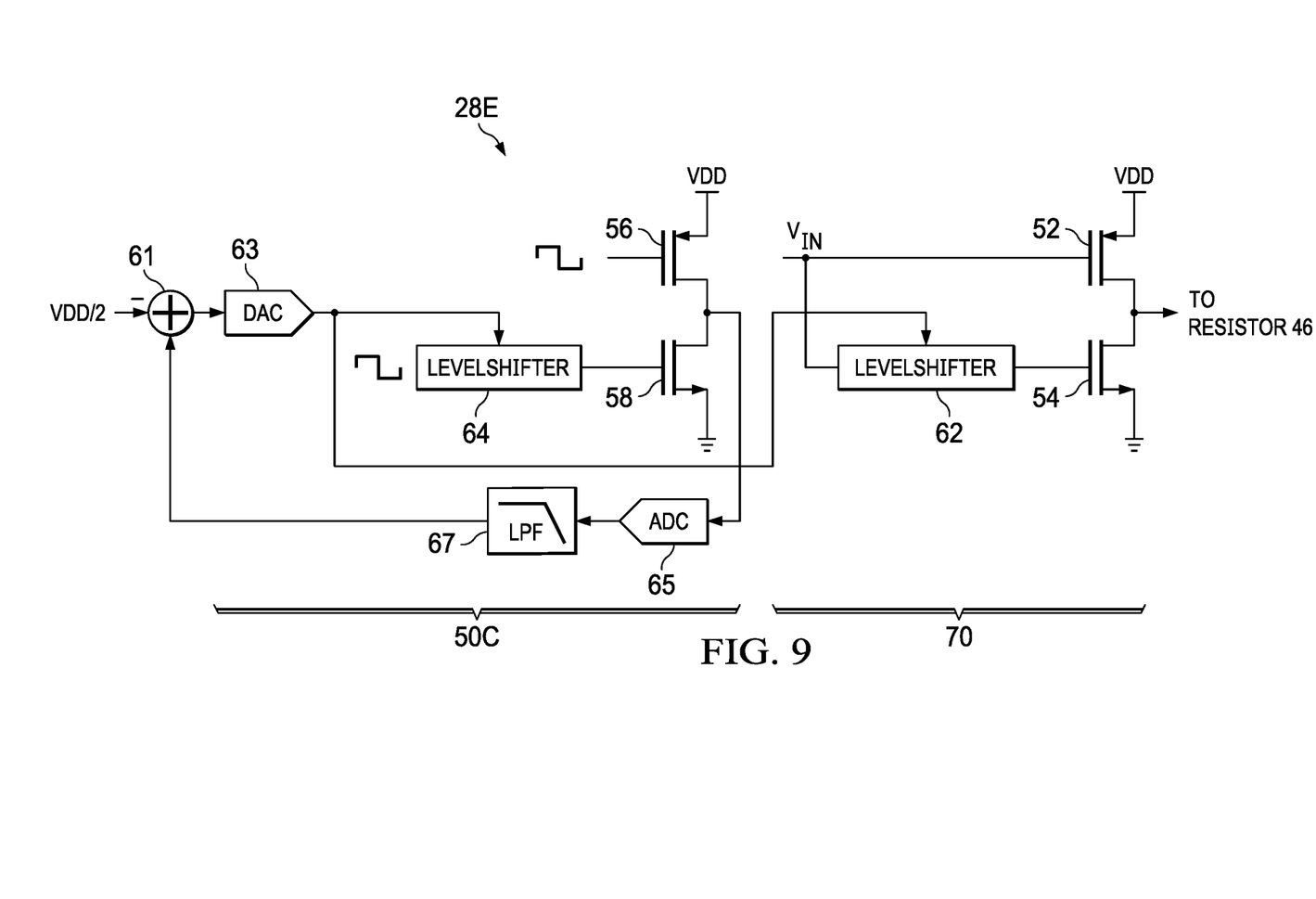
FIG. 9 illustrates a circuit diagram of another example input buffer, in accordance with embodiments of the present disclosure.

Although the foregoing input buffers 28 described above are shown as being implemented in analog circuitry, in some embodiments, all or a portion of an input buffer 28 may be implemented using digital circuitry. For example, input buffer 28C may be slightly modified to result in input buffer 28E including some digital components as shown in FIG. 9. In some embodiments of amplifier 16, example input buffer 28E may be used to implement one or more of input buffers 28. Input buffer 28E may be similar in many respects to input buffer 28C, and thus only the main differences between input buffer 28E and input buffer 28C may be described herein.

For example, input buffer 28E may include biasing subcircuit 50C in lieu of biasing subcircuit 50B. Biasing subcircuit 50C may be similar in many respects to biasing subcircuit 50B, and thus only the main differences between biasing subcircuit 50C and biasing subcircuit 50B may be described herein. For instance, biasing subcircuit 50C may include a combiner 61 in lieu of operational amplifier 60, which may receive a digital signal indicative of VDD/2 and thus perform the same functionality of operational amplifier 60, but only in the digital domain. To provide an analog voltage for biasing level shifters 64 and 62, the output of combiner 61 may be converted to the analog domain by a digital-to-analog converter 63.

Further, the output of biasing subcircuit 50C (e.g., the node at which pull-up device 56 and pull-down device 58 are coupled to one another) may be converted from the analog domain to the digital domain by an analog-to-digital converter 65. Thus, the output of biasing subcircuit 50C (e.g., the node at which pull-up device 56 and pull-down device 58 are coupled to one another) may be fed back, in digital form, to the non-inverting input of combiner 61 via a digital low-pass filter 67 present in biasing subcircuit 50C in lieu of analog low-pass filter 66. As a result, the output of biasing subcircuit 50C may be held to an average voltage of approximately VDD/2, thus ensuring impedances of pull-up device 56 and pull-down device 58 are approximately equal across all operating and process conditions. In turn, by limiting the voltage driven to the gate terminal of pull-down device 54 using level shifter 62, impedances of pull-up device 52 and pull-down device 54 may be approximately equal across all operating and process conditions, thus reducing or eliminating effects of common-mode current flowing through signal feedback network 26 to input buffers 28.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. An amplifier system comprising:
    a first stage having a plurality of inputs configured to receive a differential pulse-width modulation input signal and generate an intermediate signal based on the differential pulse-width modulation input signal;
    a quantizer configured to generate a modulated signal based on the intermediate signal;
    a single-ended class-D output stage configured to generate a single-ended output signal as a function of the differential pulse-width modulation input signal;
    a feedback network configured to feed back the single-ended output signal to a first input of the plurality of inputs and to feed back a ground voltage to a second input of the plurality of inputs;
    a plurality of buffers, each particular buffer configured to receive a respective component of the differential pulse-width modulation input signal and generate a respective buffered component; and an input network coupled between the plurality of buffers and the first stage;

wherein each particular buffer of the plurality of buffers comprises:
- a buffering subcircuit configured to buffer the respective component of the differential pulse-width modulation input signal associated with the particular buffer in order to generate the respective buffered component; and
- a biasing subcircuit configured to limit a magnitude of the respective component of the differential pulse-width modulation input signal driven to circuitry of the buffering subcircuit for driving the respective buffered component.

2. The amplifier system of claim 1, wherein the buffering subcircuit comprises:
- a pull-up device coupled to a source voltage via a first non-gate terminal of the pull-up device and coupled to the respective component of the differential pulse-width modulation input signal at its gate terminal; and
- a pull-down device coupled to a ground voltage via a first non-gate terminal of the pull-down device, coupled to limiting circuitry at its gate terminal, and coupled at a second non-gate terminal of the pull-down device to a second non-gate terminal of the pull-up device such that the respective buffered component is generated at a node to which the second non-gate terminal of the pull-down device is coupled to the second non-gate terminal of the pull-up device, the limiting circuitry configured to generate a limiting signal at the gate terminal of the pull-down device to the lesser of the respective component of the differential pulse-width modulation input signal and a limiting signal generated by the biasing circuit.

3. The amplifier system of claim 2, wherein the limiting signal generated by the biasing circuit causes approximate matching of impedances of the pull-up device and the pull-down device.

4. The amplifier system of claim 2, wherein the biasing subcircuit comprises:
- a second pull-up device coupled to the source voltage via a first non-gate terminal of the second pull-up device and coupled to ground voltage in order that the second pull-up device conducts the source voltage to a second-non-gate terminal of the pull-up device; and
- a second pull-down device coupled to a ground voltage via the first non-gate terminal of the pull-down device, coupled to an output of an operational amplifier at its gate terminal, and coupled at a second non-gate terminal of the pull-down device to the second non-gate terminal of the pull-up device and a non-inverting input of the operational amplifier, wherein an inverting input of the operational amplifier is coupled to a voltage approximately equal to one half of the source voltage, and wherein the operational amplifier generates the limiting signal at the output of the operational amplifier.

5. The amplifier system of claim 2, wherein the biasing subcircuit comprises:
- a second pull-up device coupled to the source voltage via a first non-gate terminal of the second pull-up device and driven at its gate terminal with a pulse-width modulated waveform having a fifty-percent duty cycle;
- a second pull-down device coupled to a ground voltage via the first non-gate terminal of the pull-down device and coupled at a second non-gate terminal of the pull-down device to a second non-gate terminal of the pull-up device and a non-inverting input of the operational amplifier, wherein an inverting input of the operational amplifier is coupled to a voltage approximately equal to one half of the source voltage, wherein the operational amplifier generates the limiting signal at the output of the operational amplifier; and wherein the second pull-down device is driven at its input by the lesser of the pulse-width modulated waveform having a fifty-percent duty cycle and the limiting signal.

6. The amplifier system of claim 5, wherein the second non-gate terminal of the pull-down device is coupled to the non-inverting input of the operational amplifier via a low-pass filter.

7. The amplifier system of claim 2, wherein the input network comprises a plurality of resistors, each particular resistor coupled to a respective buffer and configured to establish a gain for the amplifier system.

8. The amplifier system of claim 7, wherein each particular resistor has a plurality of selectable gain taps for selecting a resistance of the particular resistor.

9. The amplifier system of claim 8, wherein each respective buffer comprises a plurality of buffering subcircuits, each particular buffering subcircuit coupled to a respective selectable gain tap of the plurality of gain taps.

10. A method comprising, in an amplifier having a first stage having a plurality of inputs configured to receive a differential pulse-width modulation input signal and generate an intermediate signal based on the differential pulse-width modulation input signal, a quantizer configured to generate a modulated signal based on the intermediate signal, a single-ended class-D output stage configured to generate a single-ended output signal as a function of the differential pulse-width modulation input signal, and a feedback network configured to feed back the single-ended output signal to a first input of the plurality of inputs and to feed back a ground voltage to a second input of the plurality of inputs, a plurality of buffers, each particular buffer configured to receive a respective component of the differential pulse-width modulation input signal and generate a respective buffered component, and an input network coupled between the plurality of buffers and the first stage:
- buffering, with a respective buffering subcircuit of each particular buffer, the respective component of the differential pulse-width modulation input signal associated with the particular buffer in order to generate the respective buffered component; and
- limiting, with a biasing subcircuit of each particular buffer, a magnitude of the respective component of the differential pulse-width modulation input signal driven to circuitry of the buffering subcircuit for driving the respective buffered component.

11. The method of claim 10, wherein:
the buffering subcircuit comprises:
- a pull-up device coupled to a source voltage via a first non-gate terminal of the pull-up device and coupled to the respective component of the differential pulse-width modulation input signal at its gate terminal; and
- a pull-down device coupled to a ground voltage via a first non-gate terminal of the pull-down device, coupled to limiting circuitry at its gate terminal, and coupled at a second non-gate terminal of the pull-down device to a second non-gate terminal of the pull-up device such that the respective buffered component is generated at a node to which the second non-gate terminal of the pull-down device is coupled to the second non-gate terminal of the pull-up device; and the method further comprises generating a limiting signal the limiting circuitry configured to generate a limiting signal at the gate terminal of the pull-down device to the lesser of the respective component of the differential pulse-width modulation input signal and a limiting signal generated by the biasing circuit.

12. The method of claim 11, wherein the limiting signal generated by the biasing circuit causes approximate matching of impedances of the pull-up device and the pull-down device.

13. The method of claim 11, wherein:

the biasing subcircuit comprises:

a second pull-up device coupled to the source voltage via a first non-gate terminal of the second pull-up device and coupled to ground voltage in order that the second pull-up device conducts the source voltage to a second-non-gate terminal of the pull-up device; and a second pull-down device coupled to a ground voltage via the first non-gate terminal of the pull-down device, coupled to an output of an operational amplifier at its gate terminal, and coupled at a second non-gate terminal of the pull-down device to the second non-gate terminal of the pull-up device and a non-inverting input of the operational amplifier, wherein an inverting input of the operational amplifier is coupled to a voltage approximately equal to one half of the source voltage, and the method further comprises generating, by the operational amplifier, the limiting signal at the output of the operational amplifier.

14. The method of claim 11, wherein:

the biasing subcircuit comprises:

a second pull-up device coupled to the source voltage via a first non-gate terminal of the second pull-up device and driven at its gate terminal with a pulse-width modulated waveform having a fifty-percent duty cycle;

a second pull-down device coupled to a ground voltage via the first non-gate terminal of the pull-down device and coupled at a second non-gate terminal of the pull-down device to a second non-gate terminal of the pull-up device and a non-inverting input of the operational amplifier, wherein an inverting input of the operational amplifier is coupled to a voltage approximately equal to one half of the source voltage, wherein the operational amplifier generates the limiting signal at the output of the operational amplifier; and the method further comprises driving the second pull-down device at its input by the lesser of the pulse-width modulated waveform having a fifty-percent duty cycle and the limiting signal.

15. The method of claim 14, wherein the second non-gate terminal of the pull-down device is coupled to the non-inverting input of the operational amplifier via a low-pass filter.

16. The method of claim 11, wherein the input network comprises a plurality of resistors, each particular resistor coupled to a respective buffer and configured to establish a gain for the amplifier system.

17. The method of claim 16, wherein each particular resistor has a plurality of selectable gain taps for selecting a resistance of the particular resistor.

18. The method of claim 17, wherein each respective buffer comprises a plurality of buffering subcircuits, each particular buffering subcircuit coupled to a respective selectable gain tap of the plurality of gain taps.

* * * * *

UNITED STATES PATENT AND TRADEMARK OFFICE
CERTIFICATE OF CORRECTION

PATENT NO. : 11,489,498 B1
APPLICATION NO. : 17/338160
DATED : November 1, 2022
INVENTOR(S) : Prakash et al.

It is certified that error appears in the above-identified patent and that said Letters Patent is hereby corrected as shown below:

In the Specification

1. In Column 4, Line 15, delete "$Y_{IN}$." and insert -- $V_{IN}$. --, therefor.

2. In Column 4, Line 18, delete "$Y_{IN}$" and insert -- $V_{IN}$ --, therefor.

3. In Column 4, Line 26, delete "$Y_{IN}$" and insert -- $V_{IN}$ --, therefor.

4. In Column 4, Line 27, delete "$Y_{IN\_N}$." and insert -- $V_{IN\_N}$. --, therefor.

5. In Column 4, Line 30, delete "$Y_{IN}$" and insert -- $V_{IN}$ --, therefor.

6. In Column 4, Line 40, delete "$Y_{IN\_N}$" and insert -- $V_{IN\_N}$ --, therefor.

7. In Column 4, Line 45, delete "$Y_{IN\_N}$." and insert -- $V_{IN\_N}$. --, therefor.

8. In Column 4, Line 65, delete "$Y_{IN}$." and insert -- $V_{IN}$. --, therefor.

9. In Column 6, Line 10, delete "$Y_{IN}$" and insert -- $V_{IN}$ --, therefor.

10. In Column 6, Line 14, delete "$Y_{IN}$" and insert -- $V_{IN}$ --, therefor.

Signed and Sealed this
Fourteenth Day of February, 2023

Katherine Kelly Vidal
*Director of the United States Patent and Trademark Office*